(12) United States Patent
Weng et al.

(10) Patent No.: US 8,288,854 B2
(45) Date of Patent: Oct. 16, 2012

(54) SEMICONDUCTOR PACKAGE AND METHOD FOR MAKING THE SAME

(75) Inventors: Chao-Fu Weng, Kaohsiung (TW); Yi-Ting Wu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 197 days.

(21) Appl. No.: 12/783,104

(22) Filed: May 19, 2010

(65) Prior Publication Data

US 2011/0285006 A1    Nov. 24, 2011

(51) Int. Cl.
H01L 23/538  (2006.01)
H01L 21/78   (2006.01)
H01L 21/50   (2006.01)

(52) U.S. Cl. ........ 257/686; 257/678; 257/690; 257/698; 257/723; 257/777; 257/778; 257/E23.067; 257/E23.169; 361/600; 361/679.01

(58) Field of Classification Search ................ 257/686, 257/690, 698, 723, 777, 778, E23.067, E23.169; 361/600, 679

See application file for complete search history.

(56) References Cited

U.S. PATENT DOCUMENTS

| | | | | |
|---|---|---|---|---|
| 5,049,978 A | * | 9/1991 | Bates et al. | 257/686 |
| 5,198,963 A | * | 3/1993 | Gupta et al. | 361/715 |
| 5,977,640 A | * | 11/1999 | Bertin et al. | 257/777 |

* cited by examiner

*Primary Examiner* — Peniel M Gumedzoe

(74) *Attorney, Agent, or Firm* — McCracken & Frank LLC

(57) ABSTRACT

The present invention relates to a semiconductor package and method for making the same. The semiconductor package includes a silicon substrate unit, a bridge chip and at least one active chip. The silicon substrate unit has a cavity and a plurality of vias. The bridge chip is attached to the cavity and has a plurality of non-contact pads. The active chip is disposed above the bridge chip and has a plurality of non-contact pads and a plurality of conducting elements. The conducting elements of the active chip contact the vias of the silicon substrate unit, the non-contact pads of the active chip face but are not in physical contact with the non-contact pads of the bridge chip, so as to provide proximity communication between the active chip and the bridge chip.

13 Claims, 17 Drawing Sheets

SEMICONDUCTOR PACKAGE AND METHOD FOR MAKING THE SAME

BACKGROUND OF THE INVENTION

1. Field of the Invention

The present invention relates to a semiconductor package and method for making the same, and more particularly to a semiconductor package having the function of proximity communication and method for making the same.

2. Description of the Related Art

FIGS. 1 to 7 show a conventional method for making a semiconductor package. Referring to FIG. 1, a first active chip 10 and a bridge chip 11 are provided. The first active chip 10 has an active surface 101, a back surface 102, a plurality of bumps 103 and a plurality of non-contact pads 104. The non-contact pads 104 and the bumps 103 are disposed adjacent to the active surface 101. The bridge chip 11 has an active surface 111, a back surface 112 and a plurality of non-contact pads 113. The non-contact pads 113 are disposed adjacent to the active surface 111.

Referring to FIG. 2, the first active chip 10 and the bridge chip 11 are bonded together by a glue layer 12. Referring to FIG. 3, a second active chip 13 is provided. The second active chip 13 has an active surface 131, a back surface 132, a plurality of bumps 133 and a plurality of non-contact pads 134. The non-contact pads 134 and the bumps 133 are disposed adjacent to the active surface 131. Referring to FIG. 4, the second active chip 13 and the bridge chip 11 are bonded together by the glue layer 12.

Referring to FIG. 5, an organic substrate 14 is provided. The organic substrate 14 has a top surface 141, a bottom surface 142 and a cavity 143. Referring to FIG. 6, the bumps 103 of the first active chip 10 and the bumps 133 of the second active chip 13 are mounted to the top surface 141 of the organic substrate 14, so that the first active chip 10 and the second active chip 13 are electrically connected to the organic substrate 14. Referring to FIG. 7, an underfill 15 is formed between the first active chip 10 and the organic substrate 14, and the second active chip 13 and the organic substrate 14, respectively, so as to form a semiconductor package 1. In the semiconductor package 1, the non-contact pads 104 of the first active chip 10 are capacitively coupled to the non-contact pads 113 of the bridge chip 11, so as to provide proximity communication between the first active chip 10 and the bridge chip 11. The non-contact pads 134 of the second active chip 13 are capacitively coupled to the non-contact pads 113 of the bridge chip 11, so as to provide proximity communication between the second active chip 13 and the bridge chip 11.

The conventional semiconductor package 1 has the following disadvantages. First, the semiconductor package 1 warps easily due to coefficients of thermal expansion (CTE) mismatch between the organic substrate 14, the first active chip 10 and the second active chip 13. Second, the precise alignment between the first active chip 10 and the bridge chip 11, or the second active chip 13 and the bridge chip 11 is difficult, and thus the yield rate is low.

Therefore, it is necessary to provide a semiconductor package and method for making the same to solve the above problems.

SUMMARY OF THE INVENTION

The present invention is directed to a method for making a semiconductor package, comprising the following steps: (a) providing a silicon substrate, the silicon substrate comprising a plurality of silicon substrate units, each silicon substrate unit having a top surface, a bottom surface, a cavity and a plurality of vias, wherein the cavity opens at the top surface, and the vias penetrate the silicon substrate unit and are disposed around the cavity; (b) providing a plurality of bridge chips, wherein each bridge chip has an active surface, a back surface and a plurality of non-contact pads, the non-contact pads are disposed adjacent to the active surface; (c) attaching the back surfaces of the bridge chips to the cavities of the silicon substrate units, wherein the active surfaces of the bridge chips to face upward; (d) providing a plurality of active chips, wherein each active chip has a has an active surface, a back surface, a plurality of non-contact pads and a plurality of conducting elements, the non-contact pads and conducting elements are disposed adjacent to the active surface; (e) mounting the active chips to the silicon substrate, wherein the active chips are above the bridge chips, the conducting elements of the active chips contact the vias of the silicon substrate unit, the non-contact pads of the active chips face but are not in physical contact with the non-contact pads of the bridge chips, so as to provide proximity communication between the active chips and the bridge chips; and (f) sawing the silicon substrate to form a plurality of semiconductor packages.

The present invention is further directed to a semiconductor package, which comprises a silicon substrate unit, a bridge chip and at least one active chip. The silicon substrate unit has a top surface, a bottom surface, a cavity and a plurality of vias, wherein the cavity opens at the top surface, and the vias penetrate the silicon substrate unit and are disposed around the cavity. The bridge chip has an active surface, a back surface and a plurality of non-contact pads, wherein the non-contact pads are disposed adjacent to the active surface, the back surface of the bridge chip is attached to the cavity of the silicon substrate unit, the active surface of the bridge chip faces upward. The at least one active chip is disposed above the bridge chip. Each active chip has an active surface, a back surface, a plurality of non-contact pads and a plurality of conducting elements, wherein the non-contact pads and conducting elements are disposed adjacent to the active surface. The conducting elements of the active chip contact the vias of the silicon substrate unit, the non-contact pads of the active chip face but are not in physical contact with the non-contact pads of the bridge chip, so as to provide proximity communication between the active chip and the bridge chip.

The semiconductor package has the following advantages. First, there is no need of providing underfill in the semiconductor package, because there is no CTE mismatch issue. Second, there is no warpage concern for thin bridge chip. Third, the semiconductor package has precise alignment between the active chip and the bridge chip, and thus the yield rate is high.

The present invention is further directed to a method for making a semiconductor package, comprising the following steps: (a) providing a carrier; (b) providing a plurality of active chips, wherein each active chip has a has an active surface, a back surface, a plurality of non-contact pads and a plurality of conducting pads, the non-contact pads and conducting pads are disposed adjacent to the active surface; (c) attaching the active surfaces of the active chips to the carrier; (d) forming a molding material on the carrier to cover the active chips; (e) removing the carrier, so as to expose the active surfaces of the active chips; (f) forming a first dielectric layer to cover the active surfaces of the active chips; (g) forming a plurality of first openings and a plurality of second openings in the first dielectric layer, wherein the position of the non-contact pads corresponds to the first openings, and the second openings expose the conducting pads; (h) forming a plurality of redistribution layers on the first dielectric layer, wherein the redistribution layers contact the conducting pads; (i) forming a second dielectric layer on the first dielectric layer; (j) forming a plurality of third openings and a plurality of fourth openings in the second dielectric layer, wherein the third openings expose the first openings, and the fourth openings expose the redistribution layers; (k) forming a plurality of surface finish layers in the fourth openings, wherein the surface finish layers electrically connect the redistribution layers; (f) providing a plurality of bridge chips, wherein each bridge chip has an active surface, a back surface and a plurality of non-contact pads, the non-contact pads are disposed adjacent to the active surface; (m) mounting the bridge chips to the third openings of the second dielectric layer, wherein the bridge chips are above the active chips, the non-contact pads of the active chips face but are not in physical contact with the non-contact pads of the bridge chips, so as to provide proximity communication between the active chips and the bridge chips; and (n) sawing the molding material to form a plurality of semiconductor packages.

The present invention is further directed to a semiconductor package, which comprises a molding material, at least one active chip, a first dielectric layer, a redistribution layer, a second dielectric layer, a surface finish layer and a bridge chip. The molding material has a top surface, a bottom surface and at least one cavity. The cavity opens at the top surface. The active chip has an active surface, a back surface, a plurality of non-contact pads and a plurality of conducting pads. The non-contact pads and the conducting pads are disposed adjacent to the active surface, the at least one active chip are disposed in the at least one cavity of the molding material with the active surface facing upward. The first dielectric layer is disposed on the active surface of the active chip and the top surface of the molding material. The first dielectric layer has at least one first opening and a plurality of second openings, wherein the position of the non-contact pads corresponds to the first openings, and the second openings expose the conducting pads. The redistribution layer is disposed on the first dielectric layer and contacting the conducting pads. The second dielectric layer is disposed on the first dielectric layer. The second dielectric layer has a third opening and a plurality of fourth openings, wherein the third opening exposes the at least one first opening, and the fourth openings expose the redistribution layer. The surface finish layer is disposed in the fourth openings and electrically connecting the redistribution layer. The bridge chip has an active surface, a back surface and a plurality of non-contact pads. The non-contact pads are disposed adjacent to the active surface, the bridge chip are disposed in the third opening of the second dielectric layer with the active surface facing downward, wherein the non-contact pads of the active chip face but are not in physical contact with the non-contact pads of the bridge chip, so as to provide proximity communication between the active chip and the bridge chip.

DETAILED DESCRIPTION OF THE INVENTION

Figure 1:
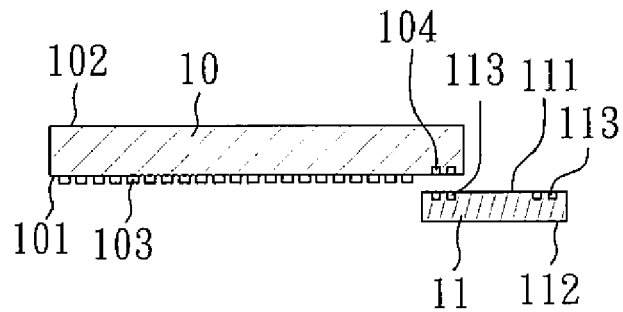
FIGS. 1 to 7 are cross-sectional views showing a conventional method for making a semiconductor package.
Figure 2:
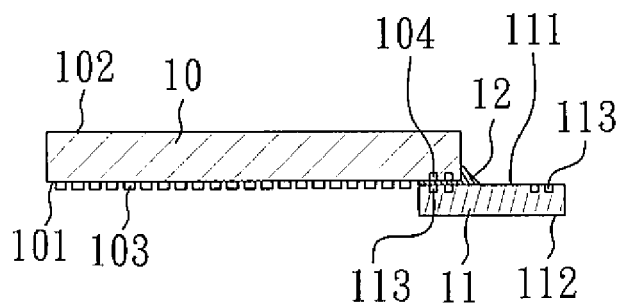
Figure 3:
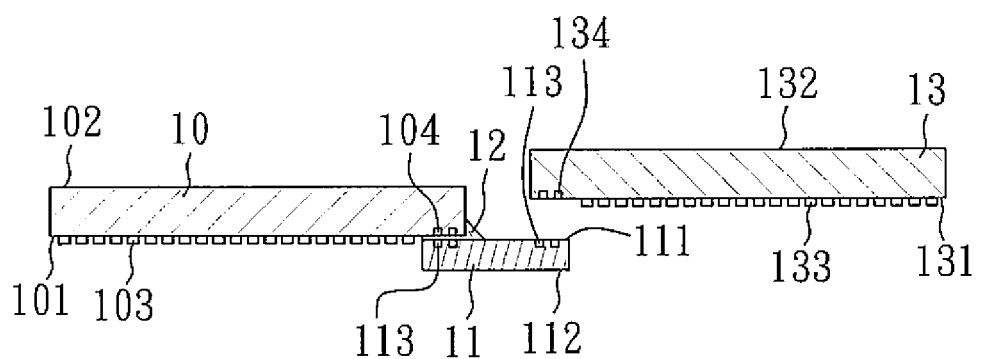
Figure 4:
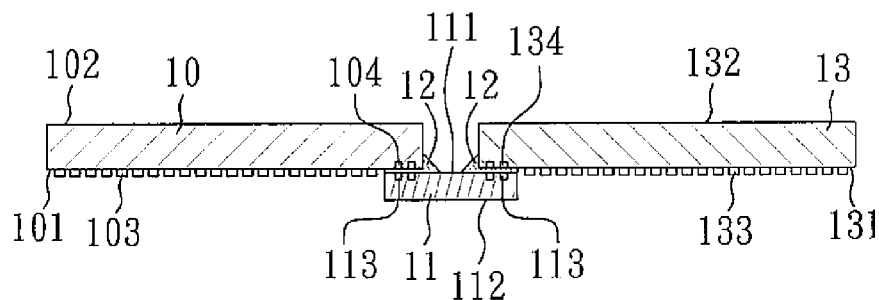
Figure 5:
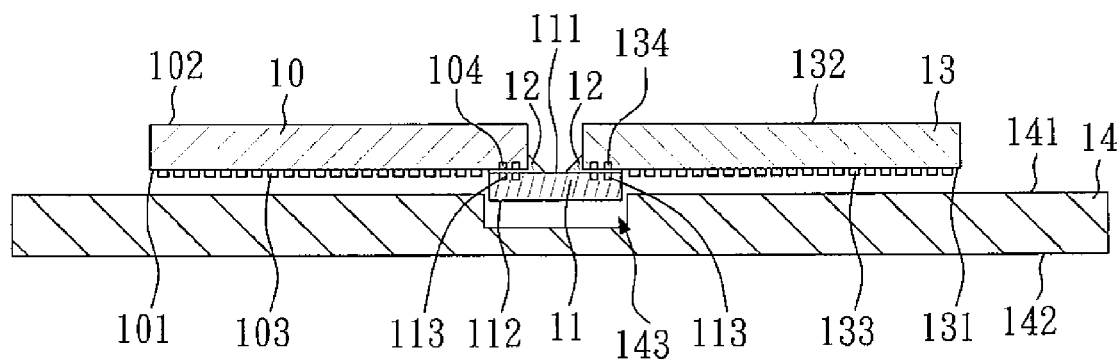
Figure 6:
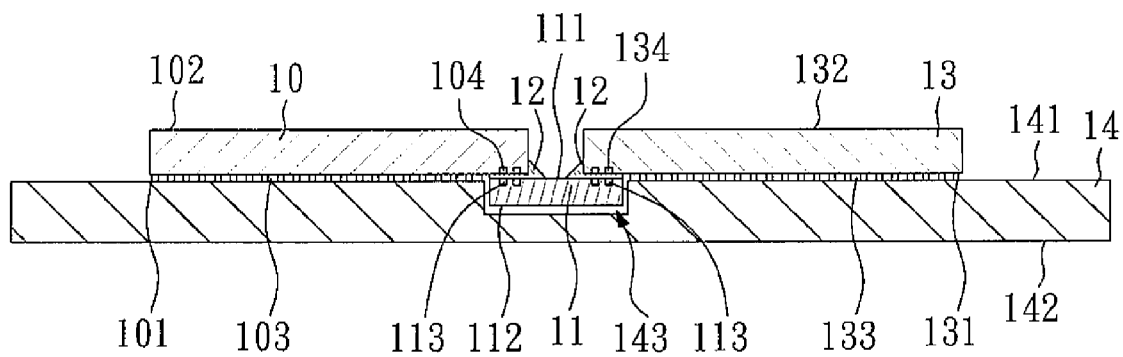
Figure 7:
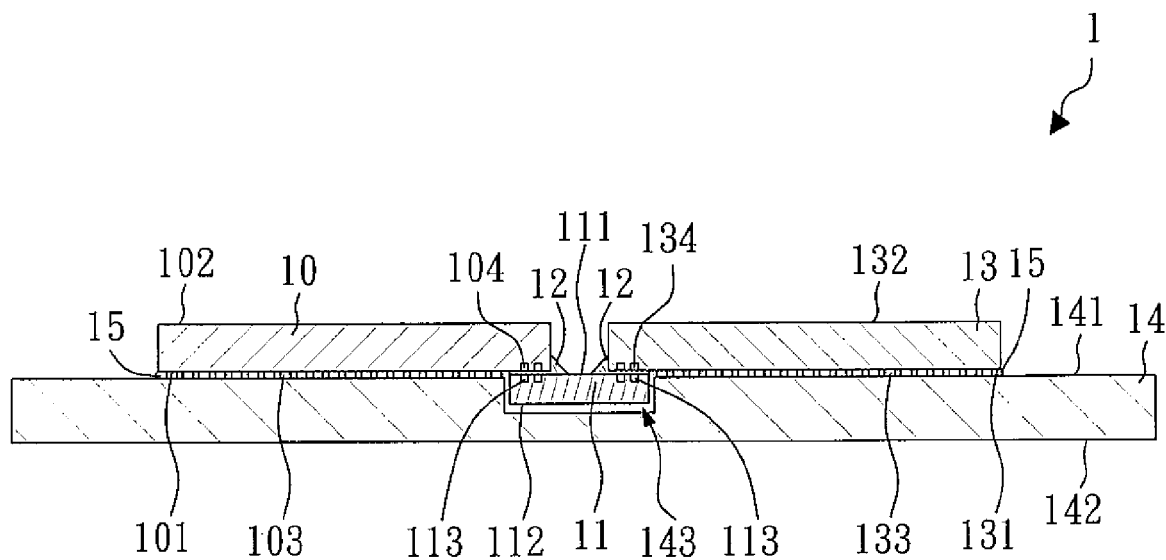
Figure 8:
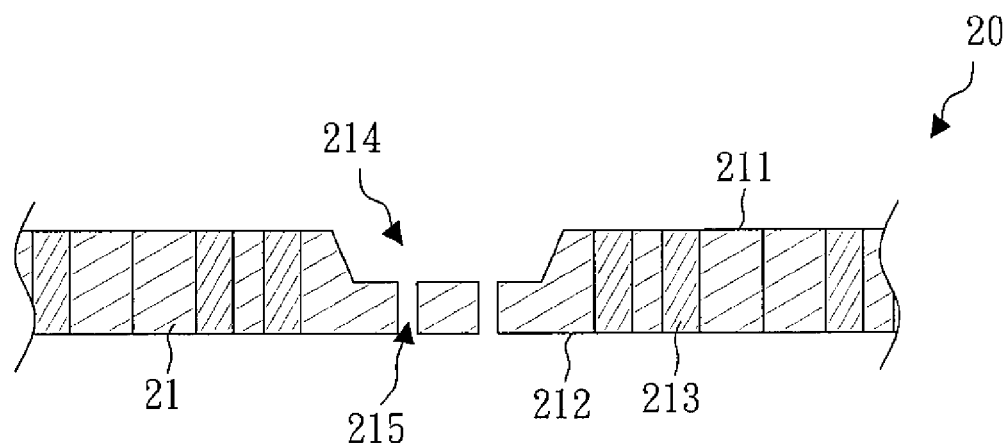
FIGS. 8 to 15 are cross-sectional views showing a method for making a semiconductor package according to a first embodiment of the present invention.
Figure 9:
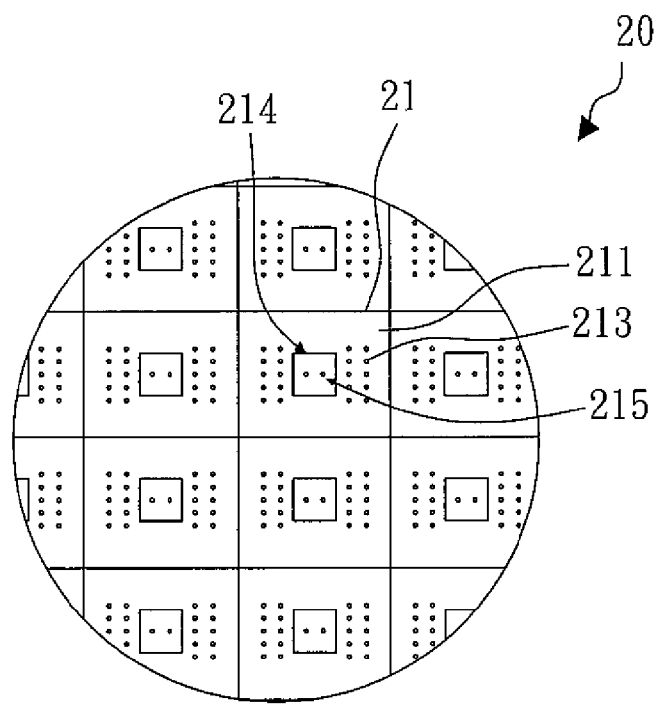
Figure 10:
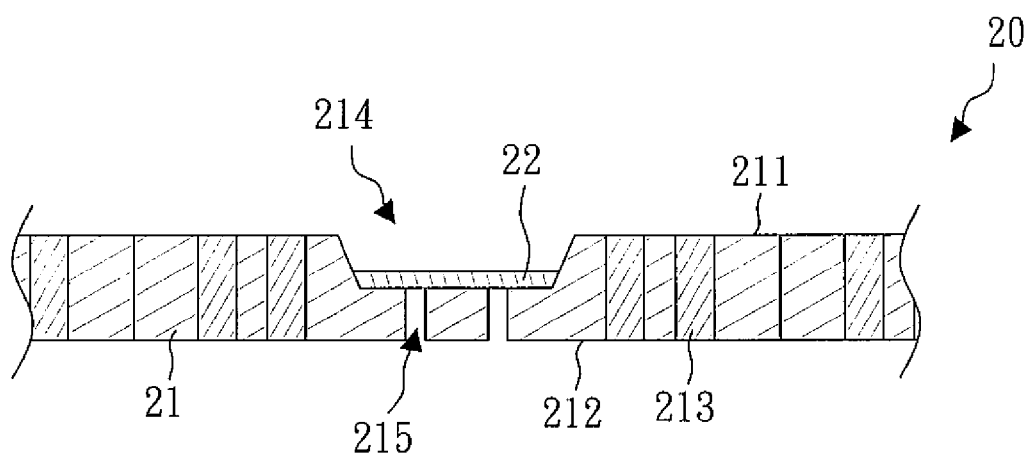

FIGS. 8 to 15 show a method for making a semiconductor package according to a first embodiment of the present invention. Referring to FIGS. 8 and 9, a silicon substrate 20 is provided. The silicon substrate 20 comprises a plurality of silicon substrate units 21. Each silicon substrate unit 21 has a top surface 211, a bottom surface 212, a cavity 214 and a plurality of vias 213. The cavity 214 opens at the top surface 211, and the vias 213 penetrate the silicon substrate unit 21 and are disposed around the cavity 214. Preferably, each silicon substrate unit 21 further has at least one through hole 215 for venting air. One end of the through hole 215 opens at the bottom of the cavity 214, and the other end of the through hole 215 opens at the bottom surface 212 of the silicon substrate unit 21. Referring to FIG. 10, a plurality of glue layers 22 are formed in the cavities 214.

Figure 11:
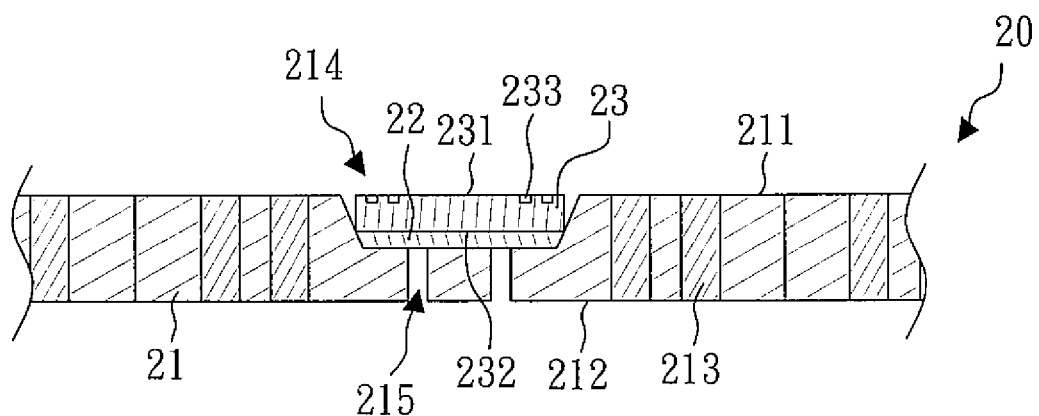

Referring to FIG. 11, a plurality of bridge chips 23 are provided. Each bridge chip 23 has an active surface 231, a back surface 232 and a plurality of non-contact pads 233. The non-contact pads 233 are disposed adjacent to the active surface 231. The back surfaces 232 of the bridge chips 23 are mounted to the cavities 214 of the silicon substrate units 21, wherein the active surfaces 231 of the bridge chips 23 face upward. In the embodiment, the back surfaces 232 of the bridge chips 23 are attached to the glue layers 22 in the cavities 214 of the silicon substrate units 21.

Figure 12:
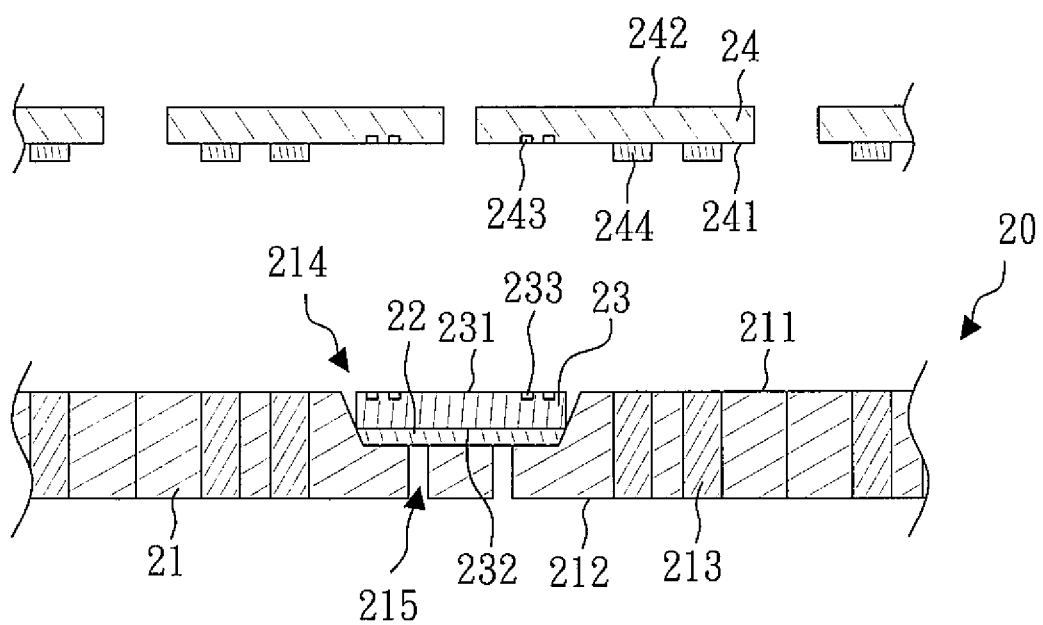

Referring to FIG. 12, a plurality of active chips 24 are provided. Each active chip 24 has a has an active surface 241, a back surface 242, a plurality of non-contact pads 243 and a plurality of conducting elements 244 (e.g., solder bumps or copper pillars). The non-contact pads 243 and conducting elements 244 are disposed adjacent to the active surface 241. In the embodiment, the non-contact pads 243 are disposed at a first end of each active chip 24, and the conducting elements 244 are disposed at a second end of each active chip 24.

Figure 13:
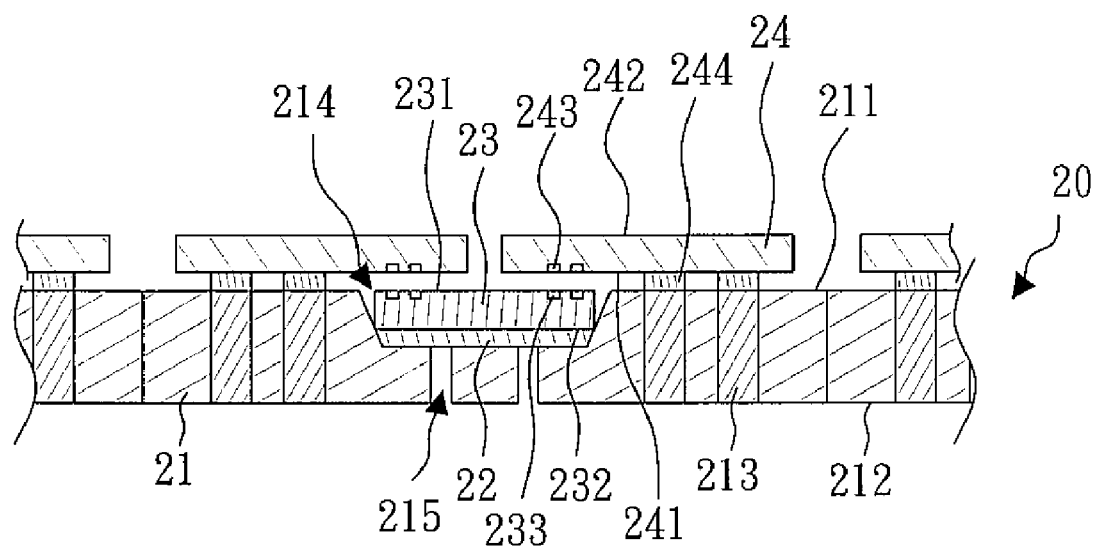
Figure 14:
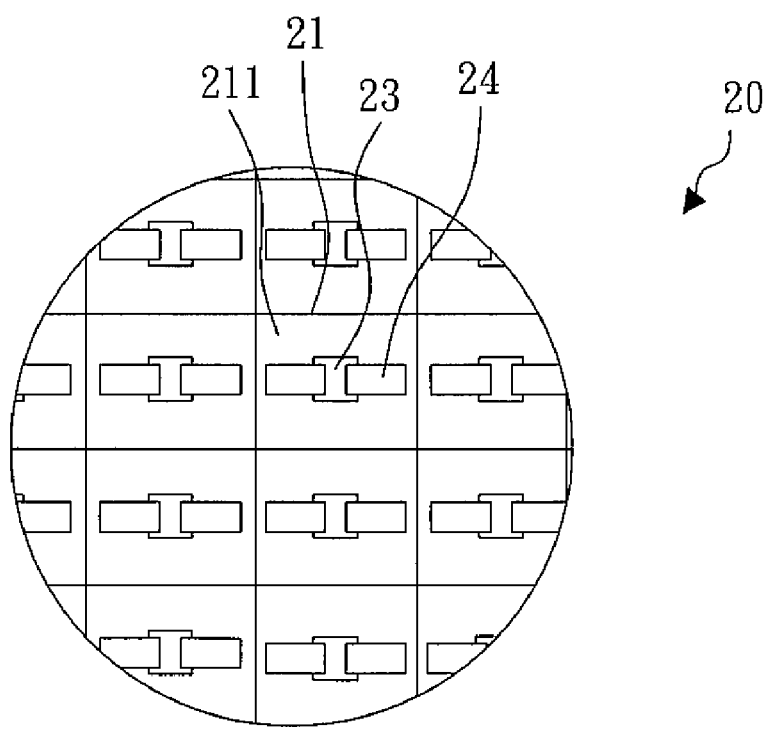

Referring to FIGS. 13 and 14, the active chips 24 are mounted to the silicon substrate 20. The active chips 24 are above the bridge chips 23. The conducting elements 244 of the active chips 24 contact the vias 213 of the silicon substrate unit 21. The non-contact pads 243 of the active chips 24 face but are not in physical contact with the non-contact pads 233 of the bridge chips 23, so as to provide proximity communication between the active chips 24 and the bridge chips 23.

It should be noted that the active chips 24 and the bridge chips 23 communicate with each other through proximity communication between the non-contact pads 243 and the non-contact pads 233, instead of direct electrical connections; however, electrical power or ground is transmitted between the active chips 24 and the silicon substrate unit 21 through direct electrical connections (e.g., the conducting elements 244 such as solder bumps or copper pillars).

In order to achieve the function of proximity communication, the non-contact pads 243 and the non-contact pads 233 are placed face-to-face in a manner that aligns the transmitter circuit with the receiver circuit in extremely close proximity, for example, with only microns of separation between them. The signals between the transmitter circuit and the receiver circuit may be transmitted by inductive or capacitive coupling with low overall communication cost.

In the embodiment, there are two active chips 24 that overlap one bridge chip 23. The two active chips 24 are end-to-end and separated apart.

Figure 15:
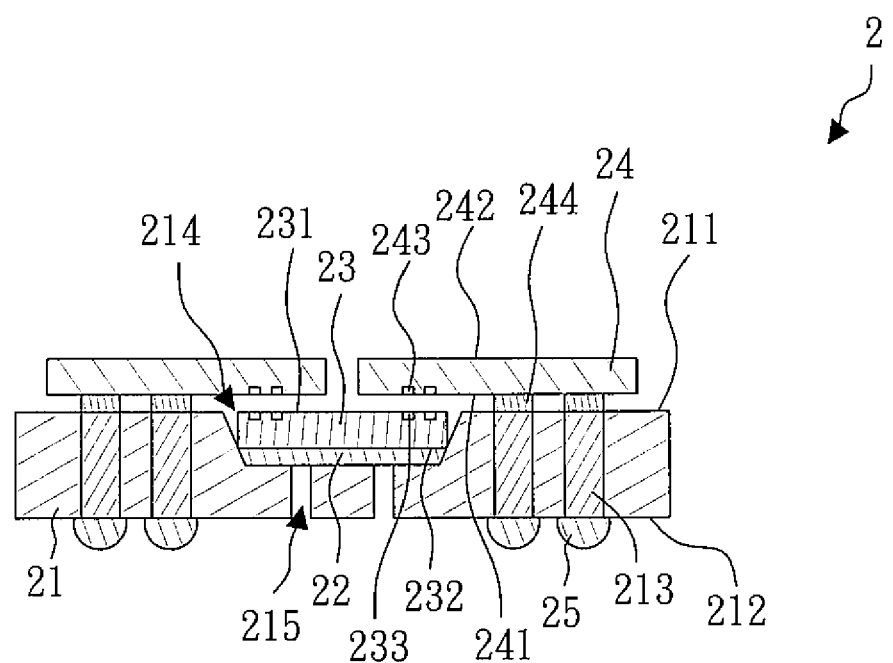

Referring to FIG. 15, a plurality of conducting elements 25 such as solder bumps or copper pillars are formed on the bottom surface 212 of each silicon substrate unit 21. Then, the silicon substrate 20 is sawed to form a plurality of semiconductor packages 2.

FIG. 15 shows a cross-sectional view of a semiconductor package according to a first embodiment of the present invention. The semiconductor package 2 comprises a silicon substrate unit 21, a bridge chip 23, at least one active chip 24 and a plurality of conducting elements 25. The silicon substrate unit 21 has a top surface 211, a bottom surface 212, a cavity 214 and a plurality of vias 213. The cavity 214 opens at the top surface 211, and the vias 213 penetrate the silicon substrate unit 21 and are disposed around the cavity 214.

In the embodiment, the silicon substrate unit 2 further has a glue layer 22 and at least one through hole 215. The through hole 215 is used for venting air when applying the glue layer 22. Therefore, the through hole 215 is an air vent hole and is empty. One end of the through hole 215 opens at the bottom of the cavity 214, and the other end of the through hole 215 opens at the bottom surface 212 of the silicon substrate unit 21. That is, the through hole 215 penetrates the silicon substrate unit 21 to communicate with the cavity 214. The glue layer 22 is disposed in the cavity 214 for attaching the back surface 232 of the bridge chip 23 in the cavity 214 of the silicon substrate unit 21.

The bridge chip 23 has an active surface 231, a back surface 232 and a plurality of non-contact pads 233. The non-contact pads 233 are disposed adjacent to the active surface 231. The back surface 232 of the bridge chip 23 is attached to the cavity 214 of the silicon substrate unit 21 by the glue layer 22. The active surface 231 of the bridge chip 23 faces upward.

The active chip 24 is disposed above the bridge chip 23, and has an active surface 241, a back surface 242, a plurality of non-contact pads 243 and a plurality of conducting elements 244 (e.g., solder bumps or copper pillars). The non-contact pads 243 and conducting elements 244 are disposed adjacent to the active surface 241. The conducting elements 244 of the active chip 24 contact the vias 213 of the silicon substrate unit 21. The non-contact pads 243 of the active chip 24 face but are not in physical contact with the non-contact pads 243 of the bridge chip 23, so as to provide proximity communication between the active chip 24 and the bridge chip 23.

In the embodiment, the non-contact pads 243 of the active chip 24 are disposed at a first end of the active chip 24, the conducting elements 244 of the active chip 24 are disposed at a second end of the active chip 24, and the active chip 24 overlaps the bridge chip 23. There are two active chips 24 that overlap one bridge chip 23. The two active chips 24 are end-to-end and separated apart. The conducting elements 25 such as solder bumps or copper pillars are disposed on the bottom surface 212 of the silicon substrate unit 21.

The semiconductor package 2 has the following advantages. First, there is no need of providing underfill in the semiconductor package 2 because there is no CTE mismatch issue. Second, there is no warpage concern for thin bridge chip 23. Third, the semiconductor package 2 has precise alignment between the active chip 24 and the bridge chip 23, and thus the yield rate is high.

Figure 16:
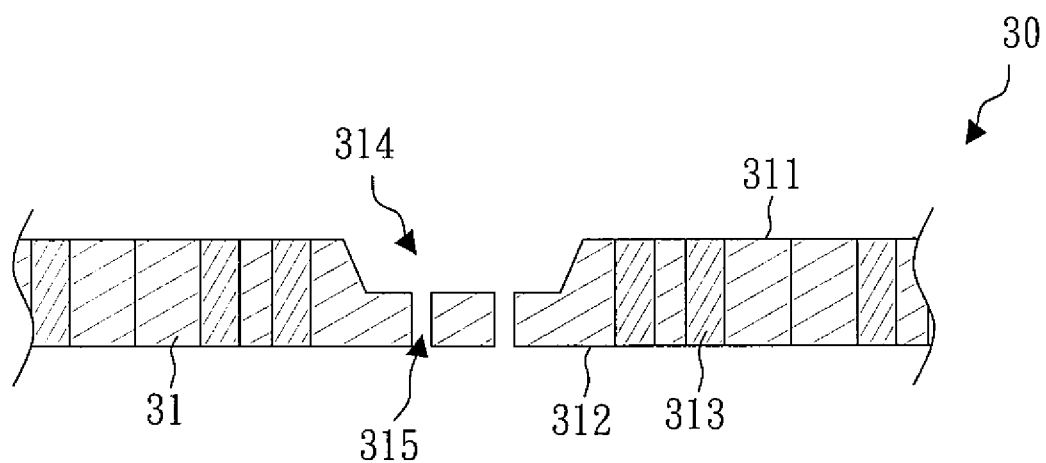
FIGS. 16 to 23 are cross-sectional views showing another method for making a semiconductor package according to a second embodiment of the present invention.
Figure 17:
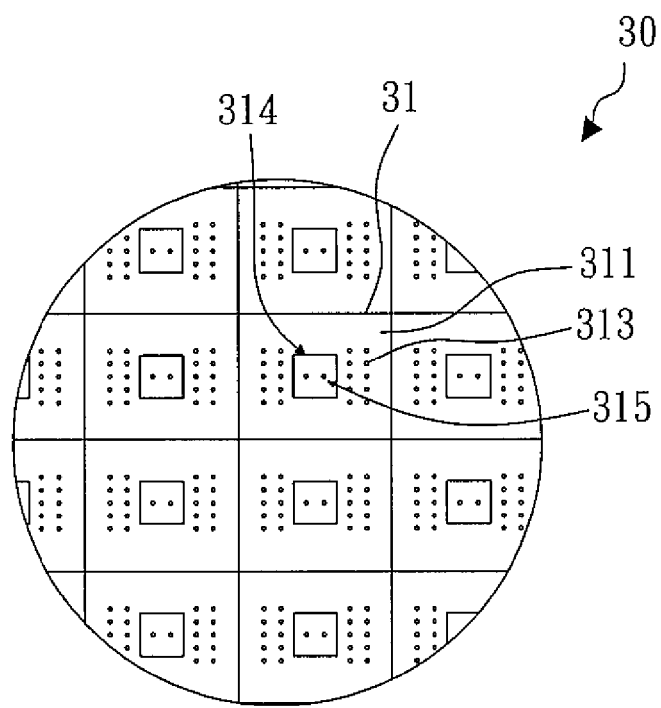
Figure 18:
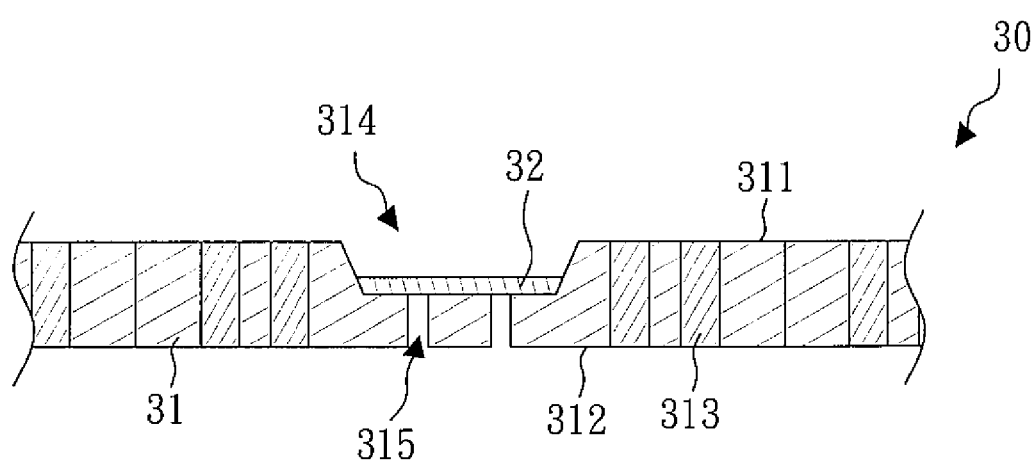

FIGS. 16 to 23 show another method for making a semiconductor package according to a second embodiment of the present invention. Referring to FIGS. 16 and 17, a silicon substrate 30 is provided. The silicon substrate 30 comprises a plurality of silicon substrate units 31. Each silicon substrate unit 31 has a top surface 311, a bottom surface 312, a cavity 314 and a plurality of vias 313. The cavity 314 opens at the top surface 311, and the vias 313 penetrate the silicon substrate unit 31 and are disposed around the cavity 314. Preferably, each silicon substrate unit 31 further has at least one through hole 315 for venting air. One end of the through hole 315 opens at the bottom of the cavity 314, and the other end of the through hole 315 opens at the bottom surface 312 of the silicon substrate unit 31. Referring to FIG. 18, a plurality of glue layers 32 are formed in the cavities 314.

Figure 19:
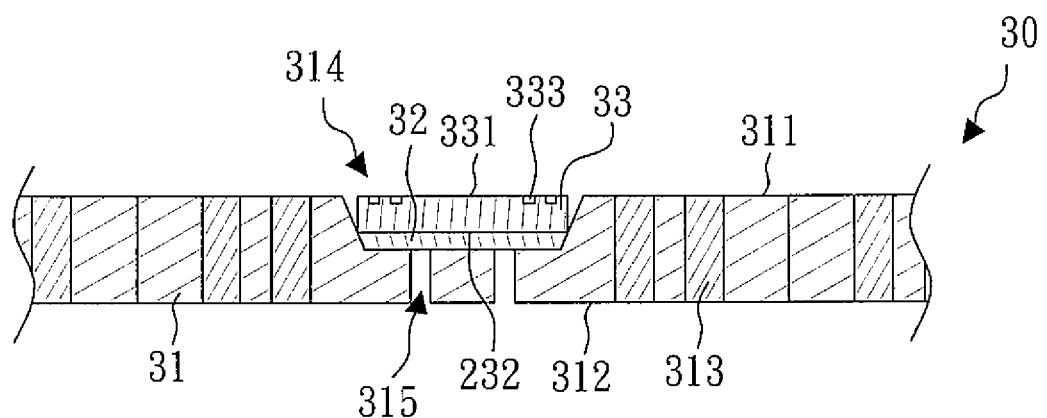

Referring to FIG. 19, a plurality of bridge chips 33 are provided. Each bridge chip 33 has an active surface 331, a back surface 332 and a plurality of non-contact pads 333. The non-contact pads 333 are disposed adjacent to the active surface 331. The back surfaces 332 of the bridge chips 33 are mounted to the cavities 314 of the silicon substrate units 31, wherein the active surfaces 331 of the bridge chips 33 face upward. In the embodiment, the back surfaces 332 of the bridge chips 33 are attached to the glue layers 32 in the cavities 314 of the silicon substrate units 31.

Figure 20:
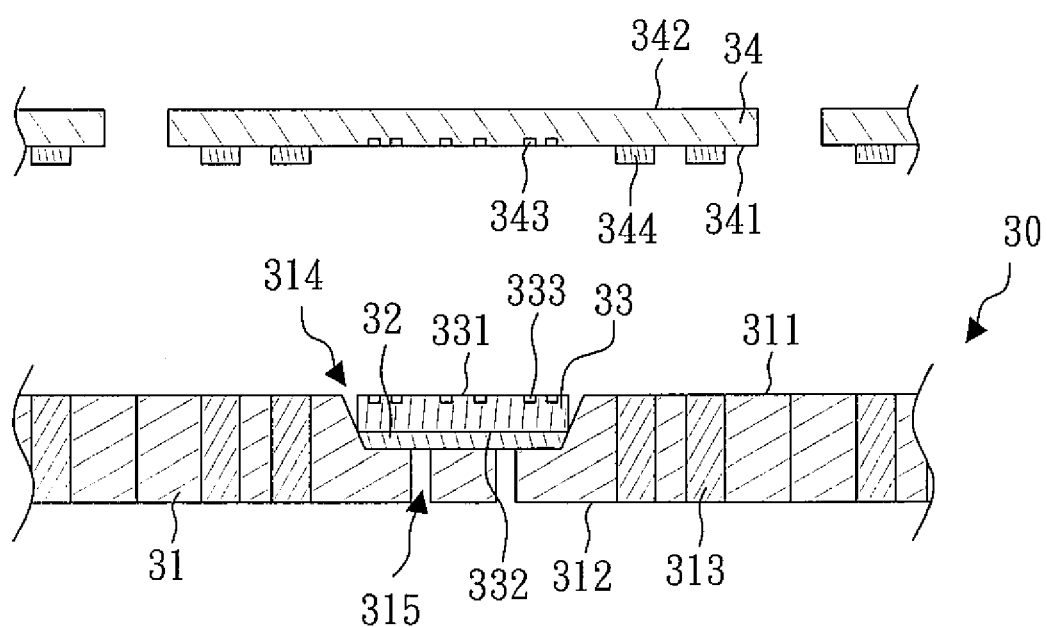

Referring to FIG. 20, a plurality of active chips 34 are provided. Each active chip 34 has a has an active surface 341, a back surface 342, a plurality of non-contact pads 343 and a plurality of conducting elements 344 (e.g., solder bumps or copper pillars). The non-contact pads 343 and conducting elements 344 are disposed adjacent to the active surface 341. In the embodiment, the non-contact pads 343 are disposed at the central portion of each active chip 34, and the conducting elements 344 are disposed at two ends of each active chip 34.

Figure 21:
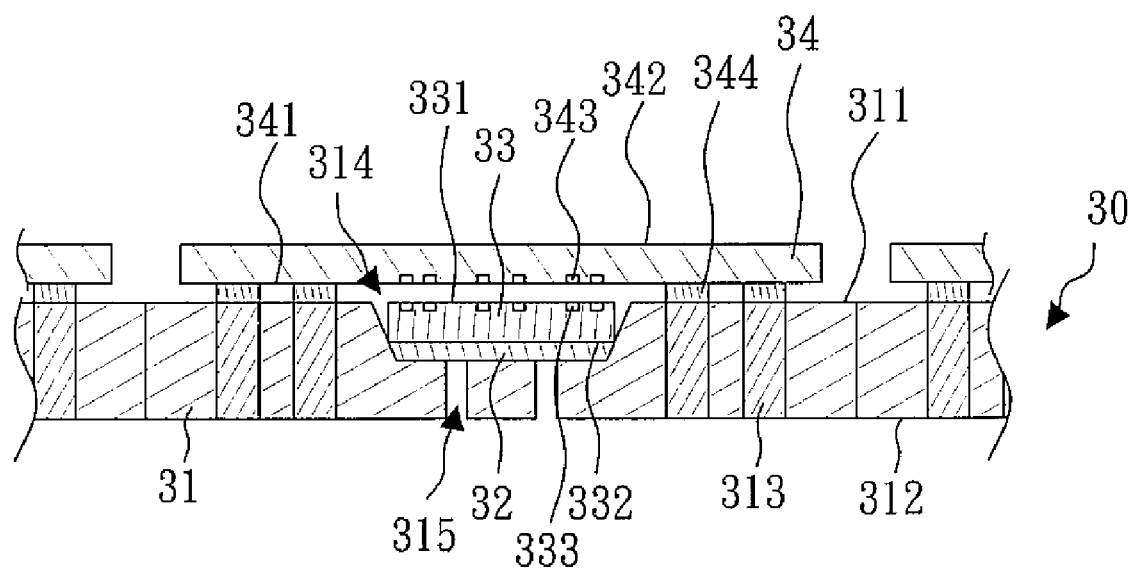
Figure 22:
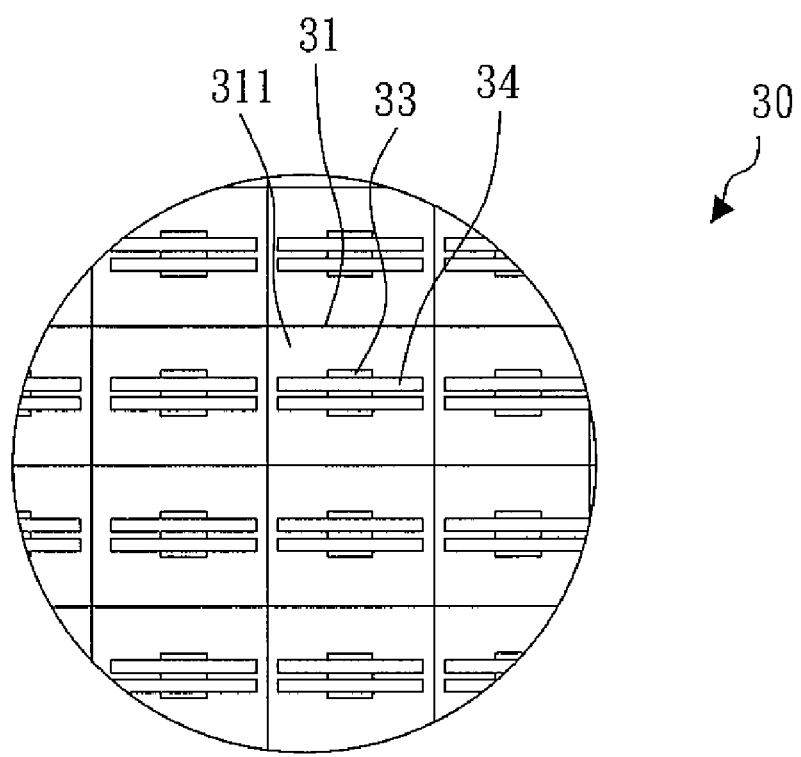

Referring to FIGS. 21 and 22, the active chips 34 are mounted to the silicon substrate 30. The active chips 34 are above the bridge chips 33. The conducting elements 344 of the active chips 34 contact the vias 313 of the silicon substrate unit 31. The non-contact pads 343 of the active chips 34 face but are not in physical contact with the non-contact pads 333 of the bridge chips 33, so as to provide proximity communication between the active chips 34 and the bridge chips 33.

In the embodiment, there are two active chips 34 disposed above one bridge chip 33. Each active chip 34 lay across the bridge chip 33.

Figure 23:
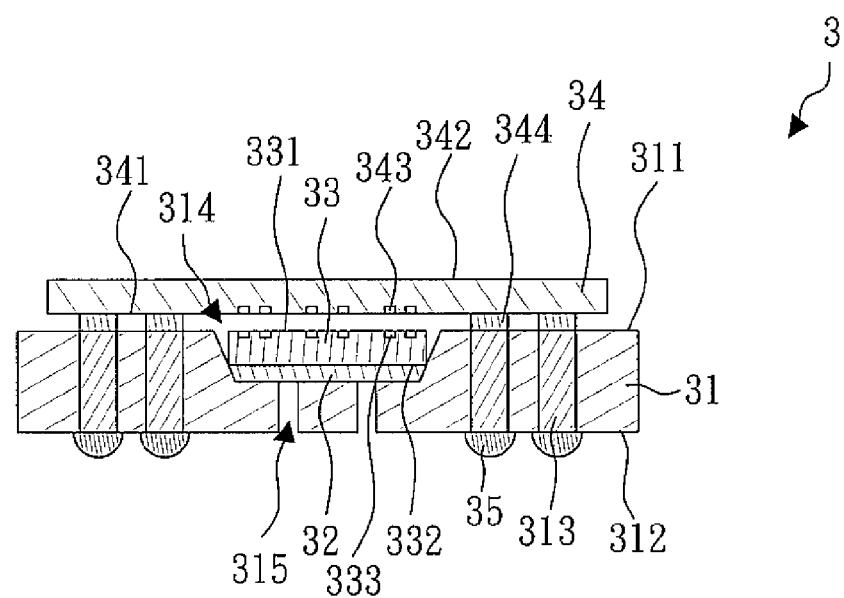

Referring to FIG. 23, a plurality of conducting elements 35 such as solder bumps or copper pillars are formed on the bottom surface 312 of each silicon substrate unit 31. Then, the silicon substrate 30 is sawed to form a plurality of semiconductor packages 3.

FIG. 23 shows a cross-sectional view of a semiconductor package according to a second embodiment of the present invention. The semiconductor package 3 comprises a silicon substrate unit 31, a bridge chip 33, at least one active chip 34 and a plurality of conducting elements 35. The silicon substrate unit 31 has a top surface 311, a bottom surface 312, a cavity 314 and a plurality of vias 313. The cavity 314 opens at the top surface 311, and the vias 313 penetrate the silicon substrate unit 31 and are disposed around the cavity 314.

In the embodiment, the silicon substrate unit 3 further has a glue layer 32 and at least one through hole 315. The through hole 315 is used for venting air when applying the glue layer 32. One end of the through hole 315 opens at the bottom of the cavity 314, and the other end of the through hole 315 opens at the bottom surface 312 of the silicon substrate unit 31. The glue layer 32 is disposed in the cavity 314 for attaching the back surface 332 of the bridge chip 33 in the cavity 314 of the silicon substrate unit 31.

The bridge chip 33 has an active surface 331, a back surface 332 and a plurality of non-contact pads 333. The non-contact pads 333 are disposed adjacent to the active surface 331. The back surface 332 of the bridge chip 33 is attached to the cavity 314 of the silicon substrate unit 31 by the glue layer 32. The active surface 331 of the bridge chip 33 faces upward.

The active chip 34 is disposed above the bridge chip 33, and has an active surface 341, a back surface 342, a plurality of non-contact pads 343 and a plurality of conducting elements 344 (e.g., solder bumps or copper pillars). The non-contact pads 343 and conducting elements 344 are disposed adjacent to the active surface 341. The conducting elements 344 of the active chip 34 contact the vias 313 of the silicon substrate unit 31. The non-contact pads 343 of the active chip 34 face but are not in physical contact with the non-contact pads 343 of the bridge chip 33, so as to provide proximity communication between the active chip 34 and the bridge chip 33.

In the embodiment, the non-contact pads 343 are disposed at the central portion of each active chip 34, and the conducting elements 344 are disposed at two ends of each active chip 34. There are two active chips 34 disposed above one bridge chip 33. Each active chip 34 lays across the bridge chip 33. The conducting elements 35 such as solder bumps or copper pillars are disposed on the bottom surface 312 of the silicon substrate unit 31.

Figure 24:
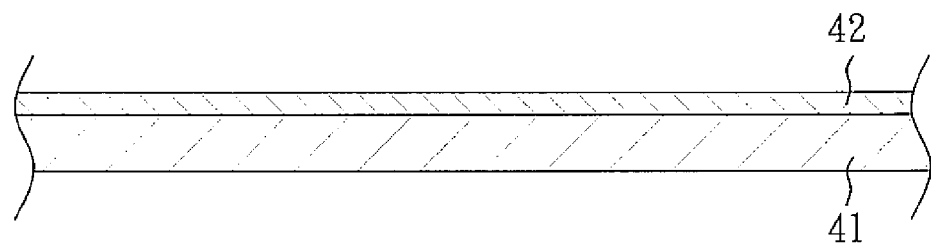
FIGS. 24 to 37 are cross-sectional views showing a method for making a semiconductor package according to a third embodiment of the present invention.
Figure 25:
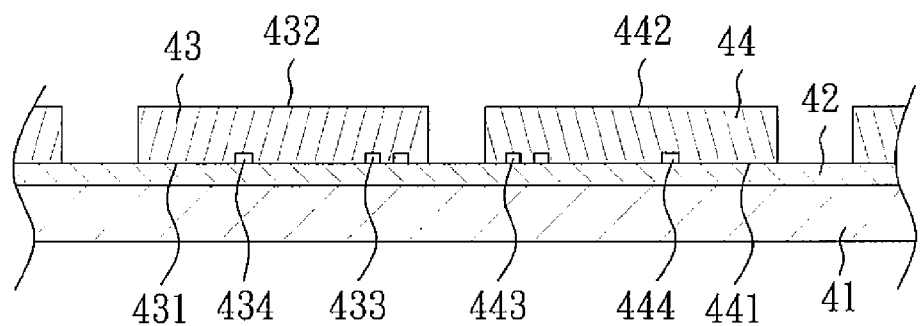

FIGS. 24 to 37 show a method for making a semiconductor package according to a third embodiment of the present invention. Referring to FIG. 24, a carrier 41 is provided. In the embodiment, the carrier 41 is a wafer having a release film 42 thereon. Referring to FIG. 25, a plurality of active chips 43, 44 are provided. The active chip 43 has a has an active surface 431, a back surface 432, a plurality of non-contact pads 433 and a plurality of conducting pads 434. The non-contact pads 433 and conducting pads 434 are disposed adjacent to the active surface 431. The active chip 44 has a has an active surface 441, a back surface 442, a plurality of non-contact pads 443 and a plurality of conducting pads 444. The non-contact pads 443 and conducting pads 444 are disposed adjacent to the active surface 441. Then, the active surfaces 431, 441 of the active chips 43, 44 are attached to the carrier 41. In the embodiment, the active surfaces 431, 441 of the active chips 43, 44 are attached to the release film 42 of the carrier 41.

Figure 26:
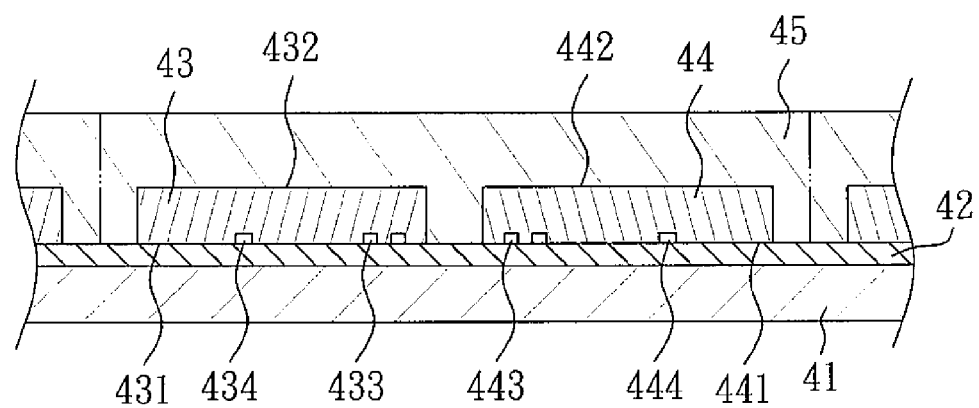
Figure 27:
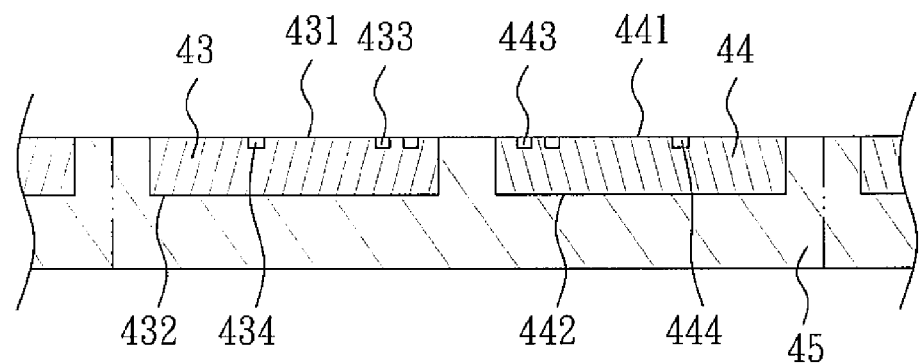
Figure 28:
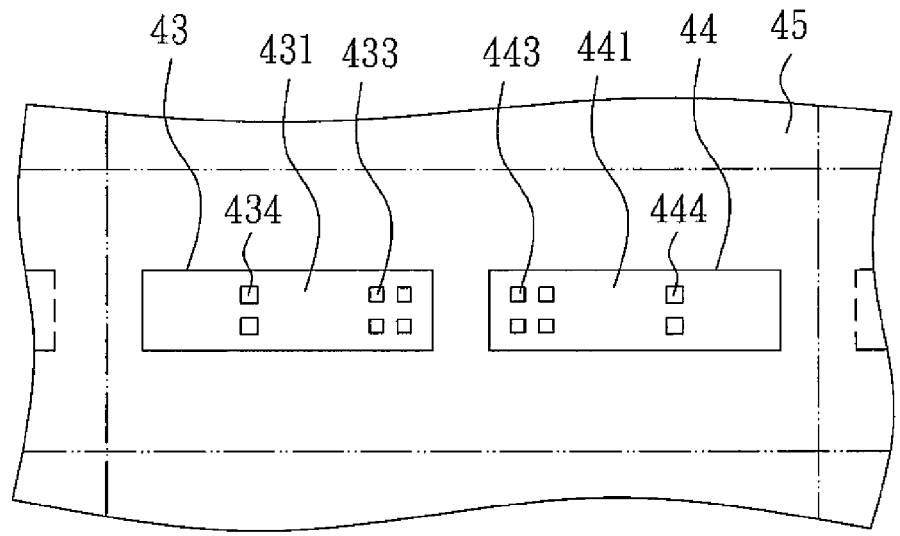

Referring to FIG. 26, a molding material 45 is formed on the carrier 41 to cover the active chips 43, 44. Referring to FIG. 27, release film 42 and the carrier 41 are removed, so as to expose the active surfaces 431, 441 of the active chips 43, 44, as shown in FIG. 28.

Figure 29:
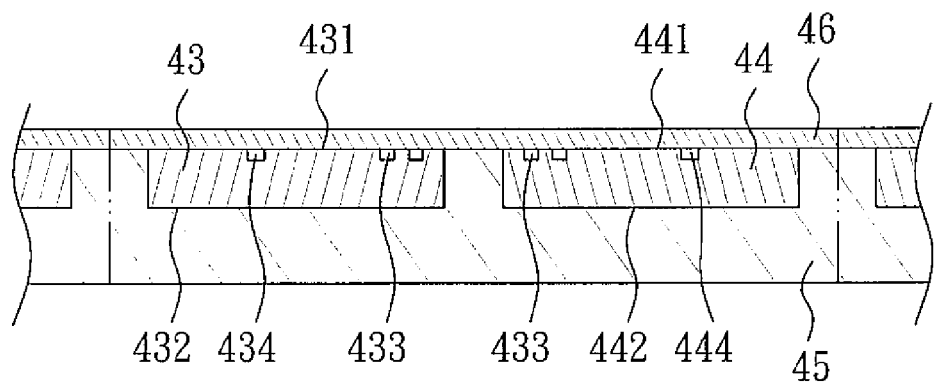
Figure 30:
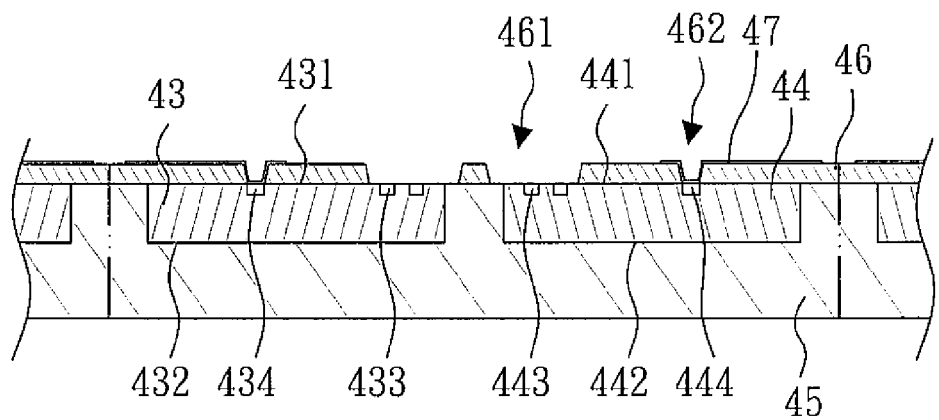
Figure 31:
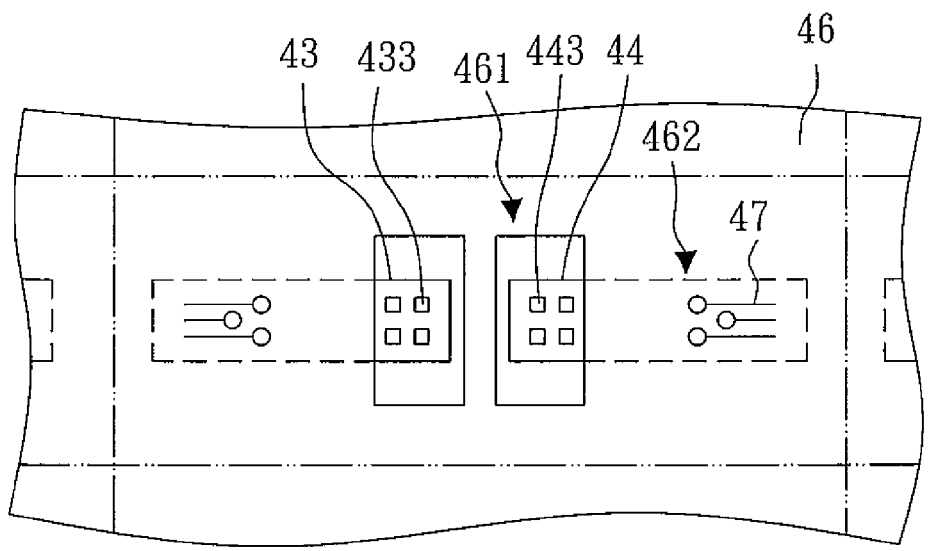

Referring to FIG. 29, a first dielectric layer 46 is formed on the molding material 45 to cover the active surfaces 431, 441 of the active chips 43, 44. Then, referring to FIG. 30, a plurality of first openings 461 and a plurality of second openings 462 are formed in the first dielectric layer 46. The position of the non-contact pads 443, 433 corresponds to the first openings 461, and the second openings 462 expose the conducting pads 434, 444. Then, a plurality of redistribution layers 47 are formed on the first dielectric layer 46. Parts of the redistribution layers 47 contact the conducting pads 434, 444 in the second openings 462, as shown in FIG. 31. In the embodiment, the first openings 461 further expose parts of the molding material 45.

Figure 32:
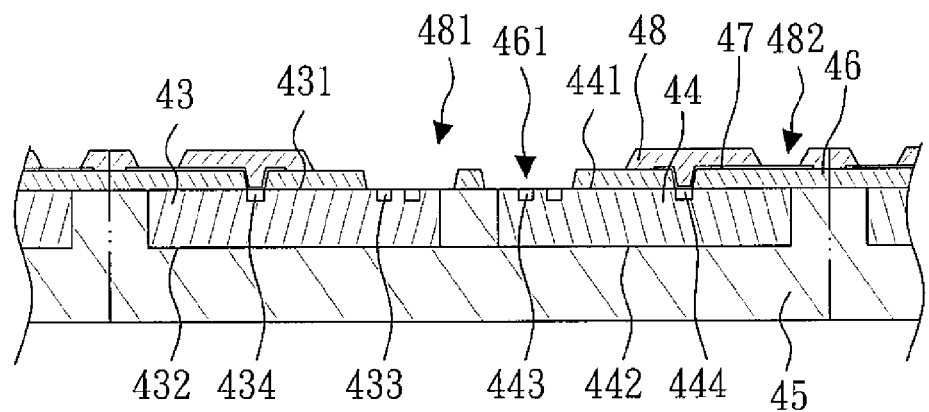

Referring to FIG. 32, a second dielectric layer 48 is formed on the first dielectric layer 46. Then, a plurality of third openings 481 and a plurality of fourth openings 482 are formed in the second dielectric layer 48. The third openings 481 expose the first openings 461, and the fourth openings 482 expose the redistribution layers 47. In the embodiment, the third openings 481 further expose parts of the first dielectric layers 46.

Figure 33:
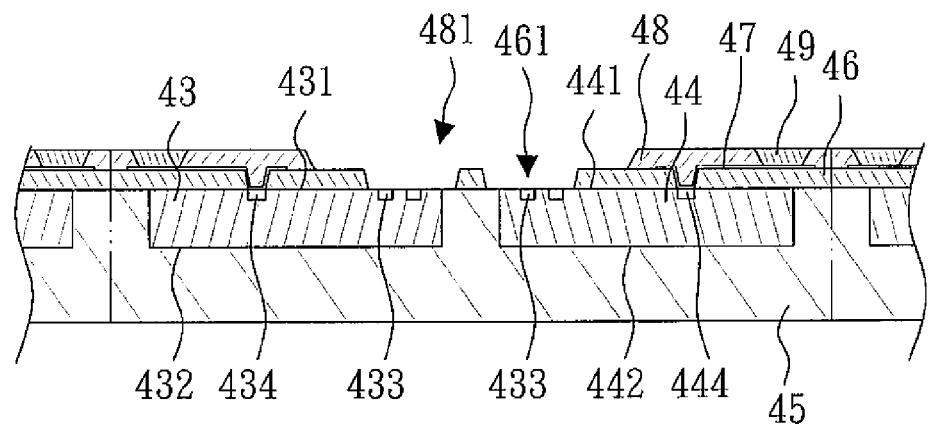
Figure 34:
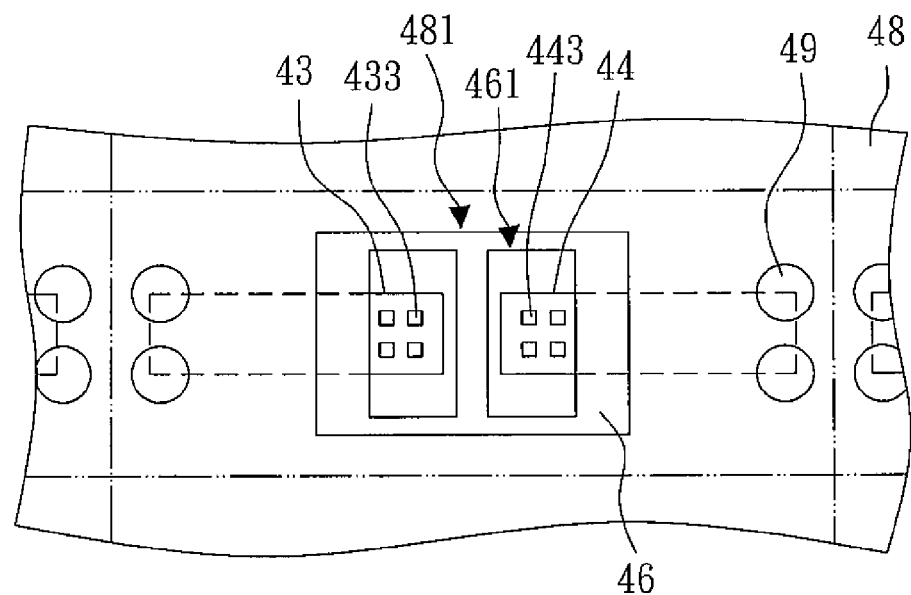

Referring to FIGS. 33 and 34, a plurality of surface finish layers 49 are formed in the fourth openings 482, wherein the surface finish layers 49 electrically connect the redistribution layers 47.

Figure 35:
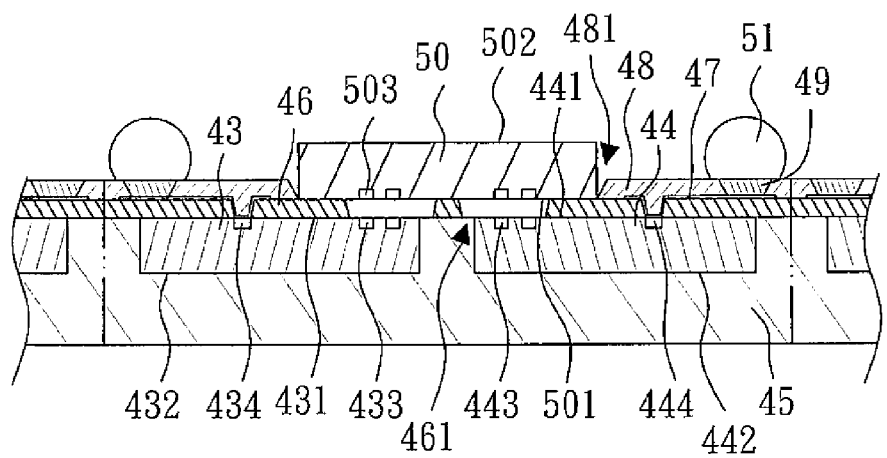
Figure 36:
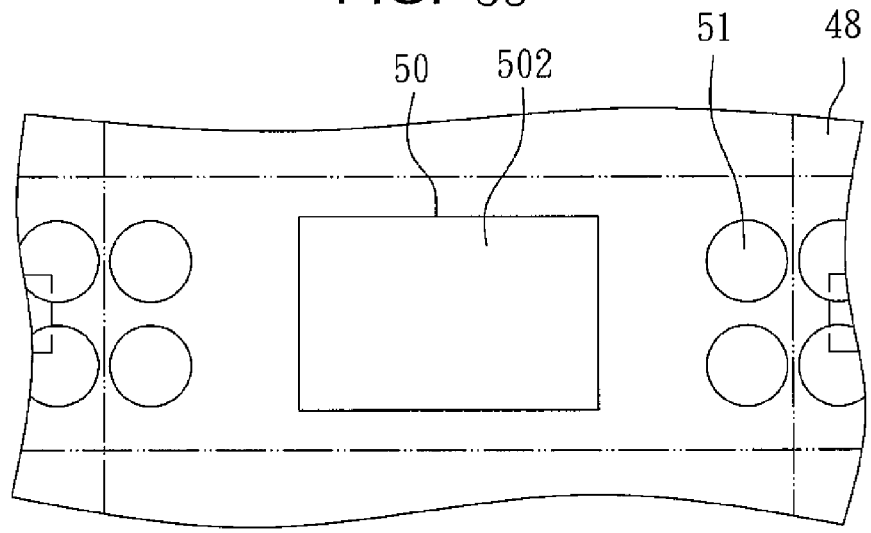

Referring to FIG. 35, a plurality of bridge chips 50 are provided. The size of each bridge chip 50 is equal to that of each third opening 481. Each bridge chip 50 has an active surface 501, a back surface 502 and a plurality of non-contact pads 503. The non-contact pads 503 are disposed adjacent to the active surface 501. Then, the bridge chips 50 are mounted to the third openings 481 of the second dielectric layer 48. The bridge chips 50 are above the active chips 43, 44. The non-contact pads 433, 443 of the active chips 43, 44 face but are not in physical contact with the non-contact pads 503 of the bridge chips 50, so as to provide proximity communication between the active chips 43, 44 and the bridge chips 50. Then, a plurality of conducting elements 51 such as solder bumps or copper pillars are formed to electrically connect the surface finish layers 49, as shown in FIG. 36.

Figure 37:
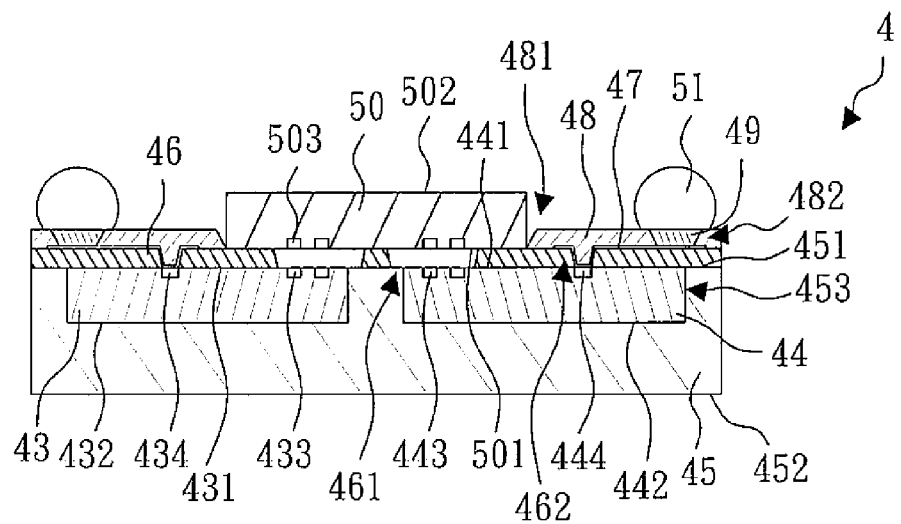

Referring to FIG. 37, the molding material 45 is sawed to form a plurality of semiconductor packages 4.

In a fourth embodiment, each bridge chip 50 further has a plurality of conducting elements 504. The conducting elements 50 are disposed adjacent to the active surface 501, and the conducting elements 504 contact part of the redistribution layers 47, as shown in the semiconductor packages 5 of FIG. 38.

In a fifth embodiment, a plurality of vias 52 are formed. The vias 52 penetrate the molding material 45 and the first dielectric layer 46, and are electrically connected to the redistribution layers 47. The vias 52 are electrically connected to a bottom circuit 53 and a bottom balls 54 disposed on the bottom surface 452 of the molding material 45, as shown in the semiconductor packages 6 of FIG. 39.

In a sixth embodiment, an interconnection layer 55 is formed on the first dielectric layer 46, and then, the second dielectric layer 48 is formed on the interconnection layer 55. Thus, the surface finish layers 49 are electrically connected to the redistribution layers 47 through the interconnection layer 55, as shown in the semiconductor packages 7 of FIG. 40. Preferably, referring to FIG. 41, the semiconductor package 7 is attached to an organic substrate 56, an underfill 57 is formed between the semiconductor package 7 and the organic substrate 56 to protect the conducting elements 51 such as solder bumps or copper pillars, a plurality of upper balls 58 are formed on the organic substrate 56, and a heat sink 59 is attached to the bottom surface 452 of the molding material 45.

FIG. 37 shows a cross-sectional view of a semiconductor package according to a third embodiment of the present invention. The semiconductor package 4 comprises a molding material 45, at least one active chip 43, 44, a first dielectric layer 46, a redistribution layer 47, a second dielectric layer 48, a surface finish layer 49 and a bridge chip 50.

The molding material 45 has a top surface 451, a bottom surface 452 and at least one cavity 453. The cavity 453 opens at the top surface 451.

The active chip 43 has a has an active surface 431, a back surface 432, a plurality of non-contact pads 433 and a plurality of conducting pads 434. The non-contact pads 433 and conducting pads 434 are disposed adjacent to the active surface 431. The active chip 44 has a has an active surface 441, a back surface 442, a plurality of non-contact pads 443 and a plurality of conducting pads 444. The non-contact pads 443 and conducting pads 444 are disposed adjacent to the active surface 441. The at least one active chip 43, 44 are disposed in the at least one cavity 453 of the molding material 45 with the active surfaces 431, 441 facing upward.

The first dielectric layer 46 is disposed on the active surfaces 431, 441 of the active chips 43, 44 and the top surface 451 of the molding material 15. The first dielectric layer 46 has at least one first opening 461 and a plurality of second openings 462. The first opening 461 exposes the non-contact pads, the position of the non-contact pads 433, 443 corresponds to the first openings 461, and the second openings 462 expose the conducting pads 444, 434. In the embodiment, the first opening 461 further exposes part of the molding material 45.

The redistribution layer 47 is disposed on the first dielectric layer 46 and contacts the conducting pads 444, 434. The second dielectric layer 48 is disposed on the first dielectric layer 46. The second dielectric layer 48 has a third opening 481 and a plurality of fourth openings 482. The third opening 481 exposes the at least one first opening 461, and the fourth openings 482 expose the redistribution layer 47. In the embodiment, the third opening 482 further exposes part of the first dielectric layer 46. The surface finish layer 49 is disposed in the fourth openings 482 and electrically connects the redistribution layer 47.

The bridge chip 50 has an active surface 501, a back surface 502 and a plurality of non-contact pads 503. The non-contact pads 503 are disposed adjacent to the active surface 501. The bridge chip 50 is disposed in the third opening 481 of the second dielectric layer 48 with the active surface 501 facing downward. The size of the bridge chip 50 is equal to that of the third opening 481. The non-contact pads 433, 443 of the active chips 43, 44 face but are not in physical contact with the non-contact pads 503 of the bridge chip 50, so as to provide proximity communication between the active chips 43, 44 and the bridge chip 50.

In the embodiment, the semiconductor package 4 further comprises a plurality of conducting elements 51 such as solder bumps or copper pillars disposed on the second dielectric layer 48 and electrically connecting the surface finish layer 49.

The semiconductor package 4 has the following advantages. First, there is no need of providing underfill in the semiconductor package 4, thus, the semiconductor package 4 will not warp easily. Second, there is no need of providing silicon substrate and micro ball interconnection. Third, the semiconductor package 4 has precise alignment between the active chip 43, 44 and the bridge chip 50, and thus the yield rate is high.

Figure 38:
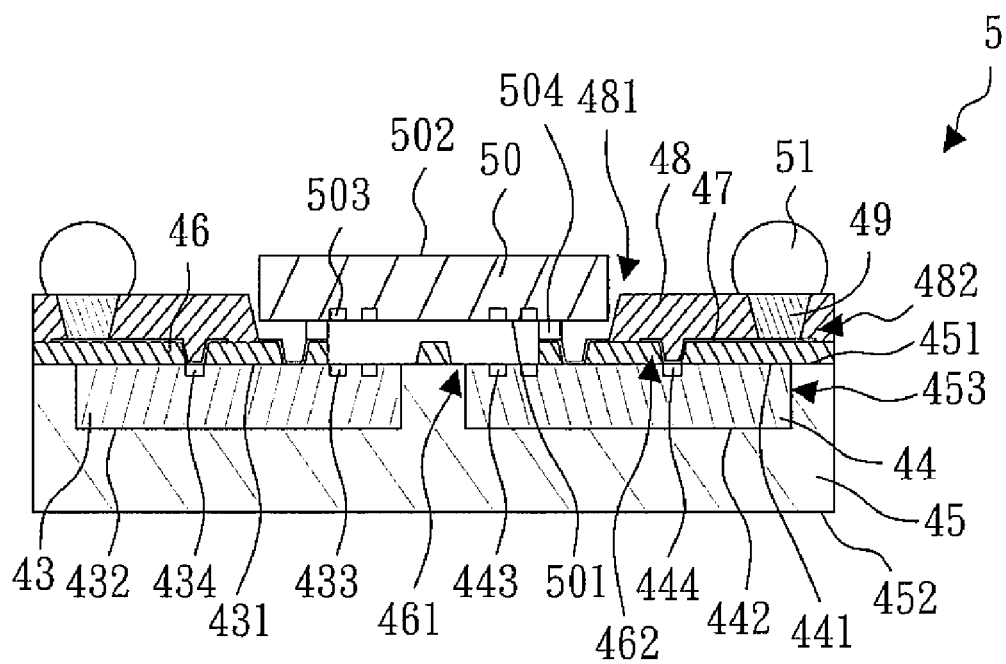
FIG. 38 is a cross-sectional view of a semiconductor package according to a fourth embodiment of the present invention.

FIG. 38 shows a cross-sectional view of a semiconductor package according to a fourth embodiment of the present invention. The semiconductor package 5 according to the fourth embodiment is substantially the same as the semiconductor package 4 (FIG. 37) according to the third embodiment, and the same elements are designated by the same reference numbers. The difference between the semiconductor package 5 and the semiconductor package 4 (FIG. 37) is as follows. In the embodiment, the bridge chip 50 further has a plurality of conducting elements 504. The conducting elements 504 are disposed adjacent to the active surface 501, and the conducting elements 504 contact part of the redistribution layers 47.

Figure 39:
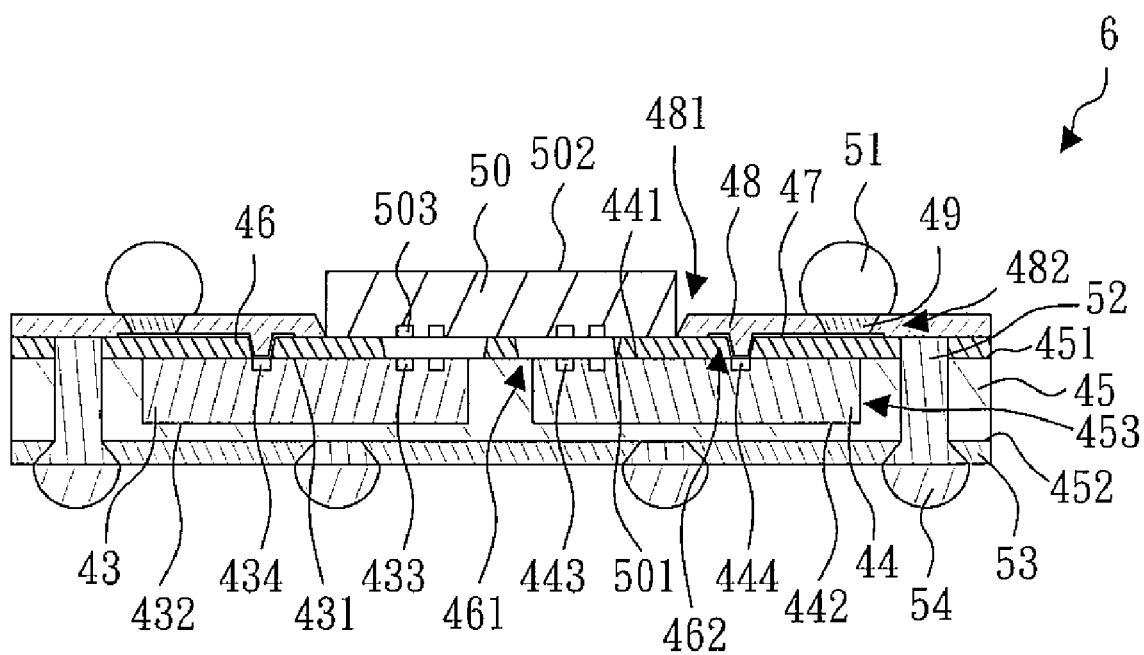
FIG. 39 is a cross-sectional view of a semiconductor package according to a fifth embodiment of the present invention.

FIG. 39 shows a cross-sectional view of a semiconductor package according to a fifth embodiment of the present invention. The semiconductor package 6 according to the fifth embodiment is substantially the same as the semiconductor package 4 (FIG. 37) according to the third embodiment, and the same elements are designated by the same reference numbers. The difference between the semiconductor package 6 and the semiconductor package 4 (FIG. 37) is as follows. In the embodiment, he semiconductor package 6 further comprises a plurality of vias 52, a bottom circuit 53 and a bottom balls 54. The vias 52 are disposed around the cavity 453. The vias 52 penetrate the molding material 45 and the first dielectric layer 46, and are electrically connected to the redistribution layer 47. The vias 52 are electrically connected to the bottom circuit 53 and the bottom balls 54 disposed on the bottom surface 452 of the molding material 45.

Figure 40:
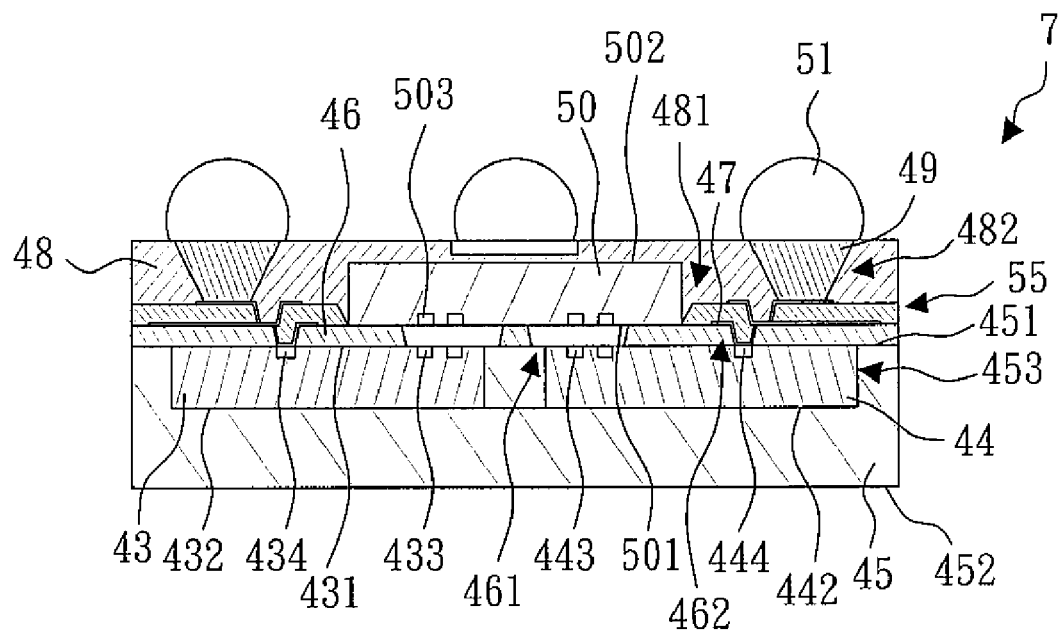
FIG. 40 is a cross-sectional view of a semiconductor package according to a sixth embodiment of the present invention.

FIG. 40 shows a cross-sectional view of a semiconductor package according to a sixth embodiment of the present invention. The semiconductor package 7 according to the sixth embodiment is substantially the same as the semiconductor package 4 (FIG. 37) according to the third embodiment, and the same elements are designated by the same reference numbers. The difference between the semiconductor package 7 and the semiconductor package 4 (FIG. 37) is as follows. In the embodiment, the semiconductor package 4 further comprises an interconnection layer 55 between the first dielectric layer 46 and the second dielectric layer 48, and the surface finish layer 49 is electrically connected to the redistribution layer 47 through the interconnection layer 55.

Figure 41:
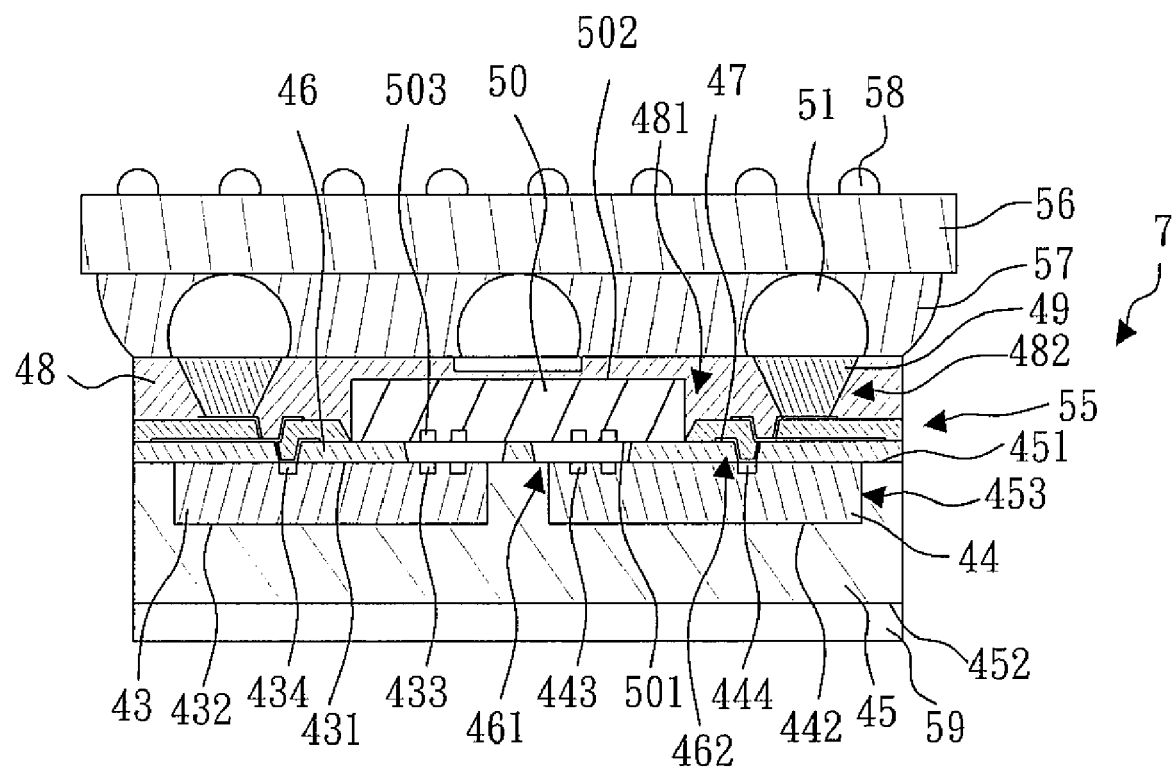
FIG. 41 is a cross-sectional view of a semiconductor package according to a seventh embodiment of the present invention.

Preferably, referring to FIG. 41, the semiconductor package 7 is attached to an organic substrate 56. The surface finish layer 49 is electrically connected to the organic substrate 56. Further, an underfill 57 is formed between the semiconductor package 7 and the organic substrate 56 to protect the conducting elements 51 such as solder bumps or copper pillars, a plurality of upper balls 58 are formed on the organic substrate 56, and a heat sink 59 is attached to the bottom surface 452 of the molding material 45.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A semiconductor package, comprising:
   a silicon substrate unit, having a top surface, a bottom surface, a cavity, a plurality of vias and at least one air vent hole, wherein the cavity opens at the top surface, and the vias penetrate the silicon substrate unit and are disposed around the cavity, one end of the air vent hole opens at the bottom of the cavity, and the other end of the air vent hole opens at the bottom surface of the silicon substrate unit;
   a bridge chip, having an active surface, a back surface and a plurality of non-contact pads, wherein the non-contact pads are disposed adjacent to the active surface, the back surface of the bridge chip is attached to the cavity of the silicon substrate unit, the active surface of the bridge chip faces upward; and
   at least one active chip, disposed above the bridge chip, each active chip has an active surface, a back surface, a plurality of non-contact pads and a plurality of conducting elements, wherein the non-contact pads and conducting elements are disposed adjacent to the active surface, the conducting elements of the active chip contact the vias of the silicon substrate unit, the non-contact pads of the active chip face but are not in physical contact with the non-contact pads of the bridge chip, so as to provide inductive or capacitive proximity communication between the active chip and the bridge chip.

2. The semiconductor package as claimed in claim 1, further comprising a glue layer disposed in the cavity for attaching the back surface of the bridge chip in the cavity of the silicon substrate unit.

3. The semiconductor package as claimed in claim 1, wherein the non-contact pads of the active chip are disposed at a first end of the active chip, the conducting elements of the active chip are disposed at a second end of each active chip, and the active chip overlaps the bridge chip.

4. The semiconductor package as claimed in claim 1, wherein the non-contact pads of the active chip are disposed at the a central portion of the active chip, the conducting elements are disposed at two ends of the active chip, and the active chip lays across the bridge chip.

5. The semiconductor package as claimed in claim 1, further comprises a plurality of solder balls disposed on the bottom surface of the silicon substrate unit.

6. A semiconductor package, comprising:
a silicon substrate unit, having a top surface, a bottom surface, a cavity, a plurality of vias and at least one air vent hole, wherein the cavity opens at the top surface, the vias penetrate the silicon substrate unit, the air vent hole penetrates the silicon substrate unit to communicate with the cavity, and is empty;
a bridge chip, having an active surface, a back surface and a plurality of non-contact pads, wherein the non-contact pads are disposed adjacent to the active surface, the back surface of the bridge chip is attached to the silicon substrate unit, the vias are disposed around the bridge chip;
at least one active chip, disposed above the bridge chip, each active chip has an active surface, a back surface and a plurality of non-contact pads, wherein the non-contact pads are disposed adjacent to the active surface, and face but are not in physical contact with the non-contact pads of the bridge chip, so as to provide inductive or capacitive proximity communication between the active chip and the bridge chip; and
a plurality of conducting elements, disposed between the active surface of the at least one active chip and the silicon substrate unit.

7. The semiconductor package as claimed in Claim 6, wherein the vias are disposed around the cavity.

8. The semiconductor package as claimed in 6, further comprising a glue layer disposed in the cavity for attaching the back surface of the bridge chip in the cavity of the silicon substrate unit.

9. The semiconductor package as claimed in 6, wherein one end of the air vent hole opens at the bottom of the cavity, and the other end of the air vent hole opens at the bottom surface of the silicon substrate unit.

10. The semiconductor package as claimed in claim 6, wherein the non-contact pads of the active chip are disposed at a first end of the active chip, the conducting elements are disposed at a second end of each active chip, and the active chip overlaps the bridge chip.

11. The semiconductor package as claimed in claim 6, wherein the non-contact pads of the active chip are disposed at a central portion of the active chip, the conducting elements are disposed at two ends of the active chip, and the active chip lays across the bridge chip.

12. The semiconductor package as claimed in claim 6, wherein the conducting elements contact the vias of the silicon substrate unit.

13. The semiconductor package as claimed in claim 6, further comprises a plurality of solder balls disposed on the bottom surface of the silicon substrate unit.

* * * * *